United States Patent [19]

Botez

[11] 4,215,319
[45] Jul. 29, 1980

[54] SINGLE FILAMENT SEMICONDUCTOR LASER

[75] Inventor: Dan Botez, Trenton, N.J.

[73] Assignee: RCA Corporation, New York, N.Y.

[21] Appl. No.: 4,143

[22] Filed: Jan. 17, 1979

Related U.S. Application Data

[63] Continuation-in-part of Ser. No. 929,776, Jul. 31, 1978, abandoned.

[51] Int. Cl.² ............................................. H01S 3/19
[52] U.S. Cl. .................................. 331/94.5 H; 357/18
[58] Field of Search ...................... 331/94.5 H; 357/18

[56] References Cited

U.S. PATENT DOCUMENTS

| | | | |
|---|---|---|---|
| 3,887,404 | 6/1975 | Chane | 156/646 |
| 3,978,428 | 8/1976 | Burnham et al. | 331/94.5 H |
| 3,983,510 | 9/1976 | Hayashi et al. | 331/94.5 H |
| 4,166,253 | 8/1979 | Small et al. | 331/94.5 H |

OTHER PUBLICATIONS

D. Botez et al, "Constricted Double–Heterostructure (AlGa)As Diode Lasers", *Appl. Phys. Lett.*, vol. 32, No. 4, Feb. 15, 1978, pp. 261-263.
D. R. Scifres et al, "Branching Waveguide Coupler in a GaAs/GaAlAs Injection Laser", *Appl. Phys. Lett.*, vol. 32, No. 10, May 15, 1978, pp. 658 -661.

*Primary Examiner*—James W. Davie
*Attorney, Agent, or Firm*—H. Christoffersen; D. S. Cohen

[57] ABSTRACT

A body of semiconductor material of a Group III-V compound or alloy of such compounds includes a substrate of one conductivity type with a pair of spaced, substantially parallel, dove-tail shaped grooves in a surface thereof. Over the surface of the substrate and the grooves are, in sequence, a first epitaxial layer of the one conductivity type, a second epitaxial layer which is the active recombination layer, a third epitaxial layer of the opposite conductivity type and a fourth epitaxial layer of the opposite conductivity type. The first and third layers are of a material forming heterojunctions with the second active layer. The second active layer has a region of uniform thickness directly over the space between the grooves. A stripe contact is provided on the fourth layer directly over the region of minimum thickness of the second active layer.

21 Claims, 7 Drawing Figures

SINGLE FILAMENT SEMICONDUCTOR LASER

BACKGROUND OF THE INVENTION

This is a continuation-in-part of my copending application Ser. No. 929,776, filed July 31, 1978, entitled, "SINGLE FILAMENT SEMICONDUCTOR LASER", now abandoned.

The present invention relates to a semiconductor laser which emits a single filament of light and particularly to such a semiconductor laser in which the portion of the filament of light can be reproducibly controlled.

There have been developed semiconductor lasers which include a body of semiconductor material, generally a Group III-V compound or alloy of such compounds, having a thin active region between regions of opposite conductivity type, i.e., a region of P type conductivity on one side of the active region and a region of N type conductivity on the other side of the active region. The active region is generally of a material which forms a heterojunction with each of the adjacent regions so that light generated is substantially confined to the active region. Such a semiconductor laser is shown and described in U.S. Pat. No. 3,747,016 to H. Kressel et al., issued July 17, 1973, entitled "SEMICONDUCTOR INJECTION LASER". One problem encountered with this type of semiconductor laser is that it emits light of more than one optical mode, particularly in the direction along the plane of the PN junction. Thus, the emitted beam of light has a complex far-field radiation pattern and is limited in its use. Also mode shifting with increasing drive current is undesirable for the uses of the laser in various practical applications.

Various semiconductor laser structures have been developed in an attempt to achieve a stable single optical mode filament of light. Initially the flow of current across the junction was limited to a central portion of the junction by having one of the contacts in the form of a narrow strip along the surface of the body. However, this technique is not completely satisfactory in achieving a single optical mode filament of light. There have been various attempts to form a buried narrow active region to achieve single optical mode output. As shown in U.S. Pat. No. 3,978,428 to R. D. Burnham et al., issued Aug. 31, 1976, entitled "BURIED-HETEROSTRUCTURE DIODE INJECTION LASER", one technique for forming a buried active region is to form a groove in a substrate and epitaxially deposit the active region in the groove. Another technique shown in U.S. Pat. No. 3,983,510 to I. Hayashi et al., issued Sept. 28, 1976, entitled "SEMICONDUCTOR DOUBLE HETEROSTRUCTURE LASER DEVICE AND METHOD OF MAKING THE SAME", is to remove portions of the body and deposit confining regions on each side of the remaining active region. However, these techniques are not completely satisfactory and are complex to carry out. In an article by D. Botez et al. entitled "CONSTRICTED DOUBLE HETEROSTRUCTURE (AlGa)As DIODE LASERS", *Applied Physics Letters*, Vol. 32, No. 4, pages 261–263, Feb. 15, 1978, there is described a semiconductor laser which provides a single optical mode of lasing light. This laser includes a substrate having a dove-tail shaped groove in a surface thereof and the regions of the laser are formed by means which are epitaxially deposited by liquid phase epitaxy in the grooves over the edges of the groove and on the surface of the substrate adjacent the groove. This provides an active region which has a narrow portion of minimum thickness adjacent one edge of the groove. A single mode filament of light is generated in this narrow portion of minimum thickness. However, this technique has the problem that the position of the thin portion of minimum thickness is not consistent from device to device so that in different devices the light emanates from different portions along the emitting end surface of the device. This also makes it difficult to know where to place the contact on the surface of the device to achieve optimum flow of current across the active region.

SUMMARY OF THE INVENTION

A semiconductor laser includes a body of semiconductor material having a substrate with a pair of spaced, substantially parallel, dove-tail shaped grooves in a surface of the substrate. A first epitaxial layer is over the surface of the substance and the surfaces of the grooves. The first epitaxial layer has a flat surface portion over the portion of the substrate surface between the grooves. A thin second epitaxial layer is over the first epitaxial layer. A third epitaxial layer is over the second epitaxial layer. The first and third epitaxial layers are of opposite conductivity types and the second epitaxial layer is the active recombination region of the laser with the light being generated in the vicinity of the portion which is over the flat surface portion of the first epitaxial layer.

DETAILED DESCRIPTION

Figure 1:
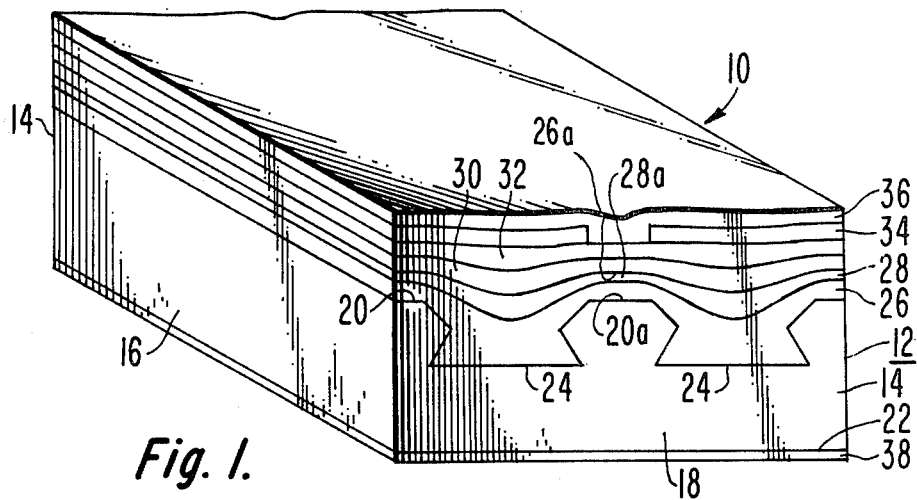
FIG. 1 is a perspective view of one form of a semiconductor laser incorporating the present invention.

Referring to FIG. 1, a form of a laser diode incorporating the present invention is generally designated as 10. The laser diode 10 comprises a body 12 of single crystal semiconductor material, generally of the Group III-V compounds or alloys of such compounds, in the form of a parallelopiped. The body 12 comprises spaced, parallel end surfaces 14 which are reflecting to light with at least one of the end surfaces being partially transparent so that the light will be emitted therefrom. The body 12 also includes spaced parallel side surfaces 16 which extend between and are perpendicular to the end surfaces 14.

The body 12 includes a substrate 18 of one conductivity type, such as N type, having spaced parallel surfaces 20 and 22 which extend between and are perpendicular to both the end surfaces 14 and side surfaces 16 of the body 12. In the surface 20 of the substrate 18 are a pair of spaced, parallel, dove-tailed shaped grooves 24 which extend between the end surfaces 14 of the body 12. The top corners of the grooves 24 are removed so that a portion of the sides of the grooves adjacent the surface 20 taper away from each other. A first epitaxial layer 26 partially fills each of the grooves 24 and extends over the portion 20a of the surface 20 between the grooves 24 and the portions on each side of the grooves 24. The first epitaxial layer 26 is of the same conductivity type as the substrate 18 and has a flat surface portion 26a over the portion of the substrate surface 20 between the grooves 24. A second epitaxial layer 28 extends over the first epitaxial layer 26. The second epitaxial layer 28 is thin and has a portion 28a of uniform thickness directly over the surface portion 20a which is between the grooves 24. A third epitaxial layer 30 is over the second epitaxial layer 28 and is of a conductivity type opposite to that of the first epitaxial layer 26. Thus, if the first epitaxial layer is N type the third epitaxial layer 30 is P type. A fourth epitaxial layer 32 of the same conductivity type as the third epitaxial layer 30 is over the third epitaxial layer. A layer 34 of an electrical insulating material such as silicon dioxide is on the fourth epitaxial layer 32 and has an opening therethrough in the form of a stripe extending over and along the surface portion 20a of the substrate 18 which is directly between the grooves 24. A conductive material contact 36 is over the insulating layer 34 and extends in the opening in the insulating layer to ohmically contact the surface of the fourth epitaxial layer 32. A conductive metal contact 38 is also on the surface 22 of the substrate 18.

The second epitaxial layer 28 provides the active recombination region of the laser diode 10. Although the second epitaxial layer 28 can be of either conductivity type, it is preferably of a material which is not intentionally doped. The first and third epitaxial layers 26 and 30 are of a material having a slightly lower index of refraction than the material of the second epitaxial layer 28 so that the second epitaxial layer 28 forms a heterojunction with each of the first and third epitaxial layers 26 and 30. These heterojunctions serve to confine the light generated within the second epitaxial layer 28 to that second epitaxial layer 28. For example, if the second epitaxial layer 28 is of gallium arsenide, each of the first and third epitaxial layers 26 and 30 can be of aluminum gallium arsenide. The second epitaxial layer 28 may also be of aluminum gallium arsenide which contains less aluminum than the material of the first and third epitaxial layer 26 and 30. The substrate 18 should be of a material which is readily available in substrate form and upon which the first epitaxial layer 26 can be easily grown. If the first epitaxial layer 26 is of aluminum gallium arsenide, the substrate 18 can be of gallium arsenide. The fourth epitaxial layer 32 is a capping layer to protect the third epitaxial layer 30. If a third epitaxial layer 30 is of aluminum gallium arsenide, the fourth epitaxial layer 32 can be of gallium arsenide.

The laser diode 10 is made by starting with a substrate 18 of the desired semiconductor material and conductivity type, such as N type gallium arsenide, having a surface 20 which is almost parallel to the (100) crystallograhic plane and slightly misoriented (up to about 3°) along the [011] crystallographic direction with respect to the (100) crystallographic plane. A masking layer 40, such as silicon dioxide, is coated over the surface 20 of the substrate 14. The silicon dioxide layer 40 may be deposited by the well known technique of pyrolitically decomposing a silicon containing gas, such as silane, in oxygen or water vapor. A pair of spaced, parallel, strip-like openings 42 and 44 are formed in the masking layer 40. This can be achieved by coating the masking layer 40 with a layer of a photoresist and providing the photoresist with openings corresponding to the openings 42 and 44 using standard photolithographic techniques. The exposed portions of the masking layer 40 can then be removed with a suitable etchant, such as buffered HF, to form the openings 42 and 44. The photoresist is then removed with a suitable solvent. The openings 42 and 44 should be arranged to extend parallel to the [011] crystallographic direction of the substrate 18 which extends to the surface 20. For reasons which will be explained later, it is preferable that each of the openings 42 and 44 be about 4 to 6 microns wide and that the center-to-center spacing between the openings 42 and 44 should be between 20 microns and 45 microns.

Figure 2:
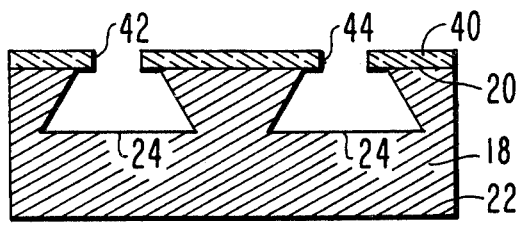
FIG. 2 is a sectional view showing the forming of the substrate for the laser diode of the present invention.

The portions of the surface 20 of the substrate 18 which are exposed through the openings 42 and 44 are then contacted with an etchant which will selectively etch [100] oriented surfaces vs. [111] oriented surfaces, such as a solution of 1 part sulfuric acid, 8 parts water and 8 parts hydrogen peroxide. As shown in FIG. 2, this results in the dove-tailed shaped grooves 24 having a depth of about 4 microns and the (100) and (111)A planes as bottoms and sides respectively. The sides of the grooves 24 will be etched back under the masking layer 40 so that starting with openings 42 and 44 which are between 4 and 6 microns wide, the grooves 24 will be about 10 to 12 microns wide at their top edge when ≃4 μm deep channels are desired. The silicon dioxide masking layer 40 is then removed with buffered HF.

The surface 20 of the substrate 18 is then cleaned to assure good epitaxial growth of the various epitaxial layers of the laser diode 10. This may be achieved by slightly etching the surface with a 1 to 1 mixture of a water solution of sodium hydroxide (8 grams sodium hydroxide to 200 ml. of water) and a water solution of hydrogen peroxide (20 ml. (30%) hydrogen peroxide to 200 ml. water) at 30° C. for about one minute. The substrate is then placed in hot hydrofluoric acid to remove any oxides which may have formed on the surface 20 and is then again slightly etched in the above-described mixture at 30° C. for ½ minute. The substrate is then washed in water and dipped in isopropyl alcohol. The substrate is then ready to have the various epitaxial layers deposited thereon.

The various epitaxial layers are deposited on the substrate 18 by the well known technique of liquid phase epitaxy using a deposition apparatus such as shown and described in U.S. Pat. No. 3,753,801 to H. F. Lockwood et al. entitled "METHOD OF DEPOSITING EPITAXIAL SEMICONDUCTOR LAYERS FROM THE LIQUID PHASE" issued Aug. 21, 1973. In general, this apparatus includes a furnace boat having a plurality of spaced wells therein, one for each epitaxial layer to be deposited, and a slide movable longitudinally through the boat and across the bottom of each of the wells. The slide contains a pair of spaced recesses in its surface which extend into each of the wells. One of the recesses is adapted to carry a source wafer and the other recess is attached to carry the substrate on which the epitaxial layers are to be deposited. In each of the wells is a charge of the semiconductor material to be deposited, a solvent for the semiconductor material, and a conductivity modifier, if one is to be used. In each of the wells over the charge is a weight for spreading out the deposition solution across the entire area of the well. If desired, a source wafer may be provided between the weight and the charge. In making the laser diode 10 it is preferable to have in the first well a source wafer between the weight and the charge.

In making the laser diode 10 a boat having at least four wells is used. The first well has therein a charge of gallium arsenide and aluminum arsenide as the semiconductor material, gallium as the solvent and tin as the N type conductivity modifier, with a source wafer of gallium arsenide over the charge. The second well includes a charge of gallium arsenide and possibly aluminum arsenide as the semiconductor material and gallium as the solvent, but no conductivity modifier. The third well includes a charge of gallium arsenide and aluminum arsenide as the semiconductor material, gallium as the solvent and germanium as the P type conductivity modifier. The fourth well contains a charge of gallium arsenide as the semiconductor material, gallium as the solvent and germanium as the P type conductivity modifier. The source wafer in the recess in the slide is of gallium arsenide. The substrate 18 having the grooves 24 therein is mounted in its appropriate recess in the slide with the grooves 24 extending parallel to the longitudinal movement of the slide.

The furance boat with the charges and the wafer therein is placed in a furnace tube and a flow of high purity hydrogen is provided through the furnace tube and over the furnace boat. The furnace tube is heated to heat the contents of the furnace boat to a temperature of between about 820° C. and 860° C. This causes the solvent to melt and the semiconductor material and conductivity modifiers to dissolve in the molten solvent. This temperature is maintained long enough to insure complete melting and homogenization of the ingredients of the charges. The furnace boat and its contents are then permitted to cool about 3° C.–5° C. and the slide is moved to carry the substrate 18 directly into the solution in the first well.

Figure 3:
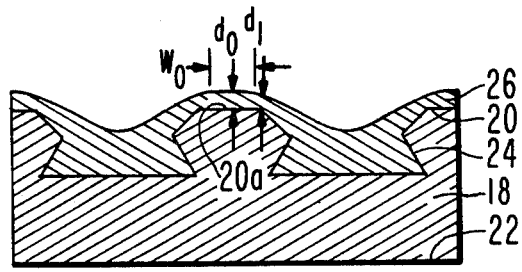
FIG. 3 is a sectional view showing the deposition of the first epitaxial layer on the substrate.

The source wafer in the slide passes through the first well without stopping and enters the second well when the substrate is brought into the first well. The source wafer between the weight and the solution in the first well is used to saturate the solution in the first well. When the surface 20 of the substrate 18 is brought into contact with the solution in the first well there will occur a partial melt back of the top corners of the grooves 24 as shown in FIG. 3. The furnace boat and its contents are then cooled at a relatively fast rate, at least about 1° C. per minute. This will cause some of the semiconductor material in the solution in the first well and some of the conductivity modifier to precipitate out of the solution and deposit in the grooves 24 and on the surface 20 of the substrate 18 to form the first epitaxial layer 26 as shown in FIG. 3. The time of depositing the first epitaxial layer 26 should be such that the thickness $d_o$ midway between the two grooves 24 should be between 0.8 micron and 2 microns and the thickness $d_1$ in the edges of the grooves 24 should be between 0.3 micron and 1 micron. It is preferable that the thickness $d_1$ be at the thinner end of its range since this will provide greater stability to the fundamental mode. Also, the portion 26a of the surface of the epitaxial layer 26 over the substrate surface portion 20 between the grooves 24 should be substantially flat over a width $w_o$ of about 4 to 15 microns.

Figure 4:
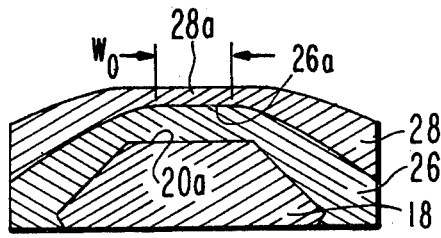
FIG. 4 is an enlarged sectional view of a portion of the laser diode showing the formation of the active layer of the laser diode.

While the first epitaxial layer 26 is being deposited on the substrate 18, the source wafer on the slide is in the second well and is saturating the solution in the second well. After the first epitaxial layer 26 of the desired thickness is deposited on the substrate 18 the slide is moved to carry the substrate into the second well where the first epitaxial layer 26 is brought into contact with the solution in the second well. The furnace boat and its contents are cooled further to cause some of the semiconductor material solution in the second well to precipitate out and deposit on the first epitaxial layer 26 to form the second epitaxial layer 28. The deposition of the semiconductor material from the solution in the second well is carried out for only a short period of time so that the portion of the second epitaxial layer over the surface portion 20a of the substrate 18 which is between the grooves 24 is very thin, between 0.5 micron and 0.3 micron. It is known that in liquid phase epitaxy the deposition rate will vary with surface curvature. The greater the amount of positive curvature, (i.e. concavity), the faster the deposition rate. Epitaxial growth will occur preferentially at the bottom of the two wells formed by the top surface of the first epitaxial layer 26 above the two grooves 24. In turn, above the flat portion 26a of the surface of the first epitaxial layer 26 which is placed above the substrate surface portion 20a, the growth is reduced due both to that surface's relatively large amount of negative curvature as well as to lateral mass transfer of grown material towards regions of enhanced growth (i.e. towards the two concave parts of the top surface of the first epitaxial layer 26, which are placed above the grooves 24). Thus, as shown in FIG. 4, the portion 28a of the second epitaxial layer 28 which is over the surface portion 20a of the substrate is uniform thickness over a region of width $w_o$ and will taper in increasing thickness as the second epitaxial layer 28 passes around the corners of the grooves 24. To achieve a second epitaxial layer 28 which is very thin, it is preferable to use a solution of small volume as described in U.S. Pat. No. 3,753,801 so as to reduce the criticality of the time of deposition.

While the second epitaxial layer 28 is being deposited on the first epitaxial layer 26, the source wafer on the slide is in the third well where it saturates the solution with the semiconductor materal. The slide is then moved into the third well to bring the second epitaxial layer 28 into contact with the solution in the third well. The temperature of the furnace boat and its contents is cooled further so as to precipitate from the solution in the third well some of the semiconductor material and the conductivity modifier. This forms the third epitaxial layer 30. The third epitaxial layer 30 is deposited for a time sufficient that the minimum thickness of the third epitaxial layer over the portion of the substrate surface 20 between the grooves 24 is between 0.9 micron and 2 microns. The slide is again moved to carry the substrate with the epitaxial layers thereon into the fourth well where the solution therein has been saturated by the source wafer. The furnace boat and its contents are cooled further to precipitate out of the solution into the fourth well some of the semiconductor material and the conductivity modifier to form the fourth epitaxial layer 32. The fourth epitaxial layer 32 preferably has a minimum thickness of between 0.2 micron and 1 micron.

Figure 5:
FIG. 5 is a sectional view of a portion of the laser diode showing one form of the capping layer which can be achieved.
Figure 6:
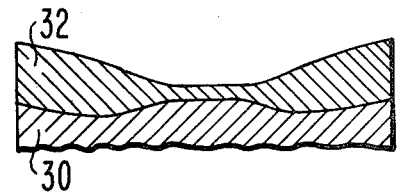
FIG. 6 is a sectional view similar to FIG. 5 but showing another form of the capping layer which can be achieved.

I have found that the surface contour of the fourth epitaxial layer 32 will vary with the thickness of the fourth epitaxial layer. If the minimum thicknesses of each of the third epitaxial layer 30 and fourth epitaxial layer 32 are at the minimum thickness given above, the surface of the fourth epitaxial layer 32 will have a slight hump therein directly over the portion of the substrate surface 20 which is between the grooves 24 as shown in FIG. 5. However, if the minimum thickness of both the third epitaxial layer 30 and the fourth epitaxial layer 32 are at the maximum stated above, the surface of the fourth epitaxial layer 32 will have a depression directly over the portion of the substrate surface 20 which is between the grooves 24 as shown in FIG. 6. In either case, there is provided a visual indication of the position of the portion of the second epitaxial layer 28 which is of uniform thickness to provide ease of locating the place where the stripe contact is to be provided.

If the substrate 18 with the epitaxial layers thereon is removed from the furnace boat, the silicon dioxide layer 34 is deposited over the fourth layer 32. This is preferably achieved by pyrolitically decomposing a gas containing silicon, such as silane, in oxygen or water vapor. A stripe shaped opening is provided in the silicon dioxide layer 34 directly over either the hump or the depression in the surface of the fourth epitaxial layer 32. As previously described, this opening can be formed by applying a photoresist over the silicon dioxide layer except for the portion where the opening is to be formed and then etching away the exposed portion of the silicon dioxide layer. The metal film 36 is then coated over the silicon dioxide layer and the exposed portion of the surface of the fourth epitaxial layer 32. This is generally achieved by the well known technique of evaporation in a vacuum. Using the same technique, the metal layer 38 is coated on the surface 22 of the substrate 18.

In the operation of the semiconductor laser 10 a current across the laser 10 between the contacts 36 and 38 of threshold value causes electrons and holes to be injected into the thin active region, i.e., the second epitaxial layer 28, where the electrons and holes recombine to generate light. Lasing occurs in the portion of the active region of uniform thickness which is directly over the flat portion 26a of the surface of the first epitaxial layer 26 which is over the substrate surface 20a between the grooves 24. Also, the light emitted from the semiconductor laser 10 is a single mode filament both spatially (transverse and lateral) and longitudinally (i.e. in frequency). This single mode lasing is achieved even when operating the semiconductor laser 10 at CW and either room temperature or 70° C. This lasing is achieved by the thin waveguide which is provided by the two heterojunctions between the second epitaxial layer 28 and each of the first and third epitaxial layers 26 and 30. Also, the width of the lasing region is controlled mainly by an antiguiding effect as well as to some extent a mode gain selectivity effect achieved by the second epitaxial layer 28 tapering in thickness in each direction from the portion of minimum thickness.

Figure 7:
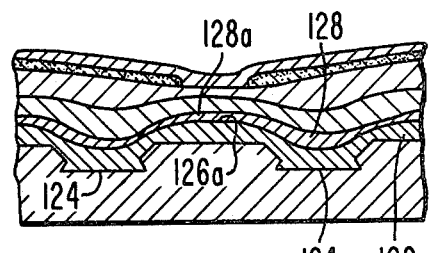
FIG. 7 is a sectional view of another form of a semiconductor laser incorporating the present invention.

Although the misorientation of the surface 20 of the substrate 18 has been described as being parallel to the longitudinal axis of the groove 24, it may be desirable to have the direction of misorientation be at an angle of between about 45° and 135° with respect to the longitudinal axis of the groove 24. As previously described, with the misorientation being parallel to the groove 24, the portion of the second epitaxial layer 28 which is over the flat surface portion 26a of the first epitaxial layer 26 is symmetrical, i.e., the tapering is generally substantially uniform at each side of the region of uniform thickness. However, as shown in FIG. 7, if the misorientation is not parallel to the groove 124 the portion 128a of the second epitaxial layer 128 which is over the flat portion 126a of the surface of the first epitaxial layer 126 is not symmetrical since the tapering at one side of the portion 128a will be greater than at the other side. This nonsymmetry becomes sufficient to affect the operation of the semiconductor laser when the misorientation is at an angle of at least about 45° with respect to the longitudinal axis of the groove 124. The effect of this nonsymmetry is that the spot of light generated in the second epitaxial layer 128 is larger than the spot of light generated in the symmetrical layer. However, whether the portion of the second epitaxial layer is symmetrical or non-symmetrical, the lasing occurs in this region which is directly over the flat portion of the surface of the first epitaxial layer.

The semiconductor laser 10 has a number of advantages over other structures which attempt to achieve single mode filament light output. With regard to the various semiconductor lasers having confining regions on each side of the active region, such as shown in U.S. Pat. No. 3,983,510, the semiconductor laser 10 of the present invention is much simpler to make since the various epitaxial layers are merely deposited in sequence on the substrate and the refined active region is automatically formed. With regard to the semiconductor laser in which the epitaxial layers are grown over a single dove-tailed groove so that the active region is along one edge of the groove, the semiconductor laser 10 of the present invention has the advantage that the location of the generated filament of light is consistently over the portion of the substrate surface 20 between the grooves 24. Also, the width of the portion as well as the amount of sideways thickness tapering of the active region can be controlled by the spacing between the grooves 24. In addition, the position of the stripe contact can be accurately determined by the shape of the surface of the fourth epitaxial layer so that the contact is aligned directly over the thinnest portion of the active region. This is desirable to assure complete current funneling across the active region where the lasing takes place. Thus, the semiconductor laser 10 of the present invention is easier to make than the diode with the active region being formed along a single dove-tailed groove with the assurance of the positioning of the active region and the stripe contact.

I claim:

1. A semiconductor laser comprising:
   a body of semiconductor material including a substrate having a surface and a pair of spaced, substantially parallel dove-tailed shaped grooves in said surface, said body having a pair of end surfaces between which said grooves extend, said end surfaces being reflective to light with at least one of said end surfaces being partially transparent to light
   a first epitaxial layer over said surface of the substrate and the surfaces of the grooves, said first epitaxial layer having a flat surface portion over the portion of the substrate surface between the grooves,
   a thin second epitaxial layer over said first epitaxial layer,
   a third epitaxial layer over said second epitaxial layer, said first and third epitaxial layers being of opposite conductivity types and the second epitaxial layer being the active recombination region of the laser with the light being generated therein in the vicinity of the portion which is over the flat surface portion of the first epitaxial layer, and a pair of contacts on said body with one contact being over said third epitaxial body and the other being on said substrate.

2. A semiconductor laser in accordance with claim 1 in which the second epitaxial layer is of a semiconductor material which forms a separate heterojunction with each of the first and third epitaxial layers.

3. A semiconductor laser in accordance with claim 2 in which said second epitaxial layer has portions which taper in thickness away from a portion of said layer which is of uniform thickness and is directly over the flat surface portion of said first epitaxial layer.

4. A semiconductor laser in accordance with claim 3 in which the second epitaxial layer tapers in increasing thickness in each direction from said section of uniform thickness.

5. A semiconductor laser in accordance with claim 3 in which the tapering portions are symmetrical.

6. A semiconductor laser in accordance with claim 3 in which the tapering portions are nonsymmetrical.

7. A semiconductor laser in accordance with claim 3 in which the corners of each of the grooves at said substrates surface are removed so that a portion of the sides of each groove adjacent said surface taper away from each other.

8. A semiconductor laser in accordance with claim 3 including a fourth epitaxial layer on said third epitaxial layer and of the same conductivity type as the third epitaxial layer.

9. A semiconductor laser in accordance with claim 8 in which the conductive contact is over said fourth epitaxial layer and engages said fourth epitaxial layer along a stripe which is over and extends along the portion of the second epitaxial layer of uniform thickness.

10. A semiconductor laser in accordance with claim 9 in which the surface of the fourth epitaxial layer has a slight hump over and extending along the thinnest portion of the second epitaxial layer and the contact engages the fourth epitaxial layer along said hump.

11. A semiconductor laser in accordance with claim 9 in which the surface of the fourth epitaxial layer has a depression therein over and extending along the thinnest portion of the second epitaxial layer and the contact increases the fourth epitaxial layer along said depression.

12. A semiconductor laser in accordance with claim 8 including a layer of an electrical insulating material on and covering said fourth epitaxial layer, said insulating layer having an opening therethrough to expose a stripe of the surface of the fourth epitaxial layer which extends along the portion of the second epitaxial layer of uniform thickness and a conductive contact on the insulating layer and the exposed surface of the fourth epitaxial layer.

13. A semiconductor laser in accordance with claim 3 in which the substrate is of gallium arsenide with said surface being almost parallel to the (100) crystallographic plane.

14. A semiconductor laser in accordance with claim 13 in which said surface of the substrate is misoriented up to 3° from the (100) crystallographic plane.

15. A semiconductor laser in accordance with claim 14 in which the misorientation of said surface of the substrate is parallel to the longitudinal axis of the groove.

16. A semiconductor laser in accordance with claim 14 in which the misorientation of said surface of the substrate is along a line not parallel to the longitudinal axis of the grooves.

17. A semiconductor laser in accordance with claim 16 in which the misorientation of said structure is along a line which is at an angle of 45° to 90° with respect to the longitudinal axis of the grooves.

18. A semiconductor laser comprising:
a parallelopiped body of semiconductor material having spaced, parallel end surfaces and spaced, parallel side surfaces extending between said end surfaces, said end surfaces being reflective to light with at least one of said end surfaces being partially transparent to light,
said body including a substrate having a surface which extends between said end and side surfaces of said body and a pair of spaced, substantially parallel dove-tailed shaped grooves in said substrate surface, said grooves extending between said body and surfaces,
a first epitaxial layer over said surface of the substrate and the surface of the grooves, said first epitaxial layer having a flat surface portion over the portion of the substrate surface between the grooves,
a thin second epitaxial layer over said first epitaxial layer, said second epitaxial layer having a portion of substantially uniform thickness over the portion of the substrate surface which is between said grooves and tapering in thickness in each direction from the portion of uniform thickness,
a third epitaxial layer over said second epitaxial layer,
a fourth epitaxial layer over said third epitaxial layer,
said substrate and first epitaxial layer being of one conductivity type and each of said third and fourth epitaxial layers being of the opposite conductivity type,
said second epitaxial layer being of a material which forms a separate heterojunction with each of said first and third epitaxial layers,
a first conductive contact over said fourth epitaxial layer and engaging said fourth epitaxial layer along a stripe which is over the thinnest portion of the second epitaxial layer and extending between the end surfaces of the body, and
a second conductive contact on a surface of the substrate which is opposite to and spaced from the surface containing the grooves.

19. A semiconductor laser in accordance with claim 13 in which the corners of each of the grooves at said substrate surface are removed so that a portion of the sides of each groove adjacent each surface taper away from each other.

20. A semiconductor laser in accordance with claim 18 including a layer of electrical insulating material on and covering said fourth epitaxial layer, said insulating layer having an opening therethrough to expose a stripe of the surface of the fourth epitaxial layer which extends along the thinnest portion of the second epitaxial layer, and the first conductive contact is on the insulating layer of the exposed surface of the fourth epitaxial layer.

21. A semiconductor laser in accordance with claim 18 in which the substrate and the fourth epitaxial layer are of gallium arsenide and the first and third epitaxial layers are of aluminum gallium arsenide.

* * * * *

UNITED STATES PATENT AND TRADEMARK OFFICE
CERTIFICATE OF CORRECTION

PATENT NO. : 4,215,319

DATED : July 29, 1980

INVENTOR(S) : Dan Botez

It is certified that error appears in the above-identified patent and that said Letters Patent is hereby corrected as shown below:

Column 2, line 19, "substance" should be --substrate--.

Column 4, lines 2 and 3, "strip-like" should be --stripe-like--.

Column 6, line 43, "materal" should be --material--.

Column 10, line 50, "13" should be --18--.

Signed and Sealed this

Fourth Day of November 1980

[SEAL]

Attest:

SIDNEY A. DIAMOND

Attesting Officer

Commissioner of Patents and Trademarks